(12) United States Patent
Lin et al.

(10) Patent No.: US 10,707,320 B2
(45) Date of Patent: Jul. 7, 2020

(54) FIELD EFFECT TRANSISTORS WITH FERROELECTRIC DIELECTRIC MATERIALS

(71) Applicant: Taiwan Semiconductor Manufacturing Co., Ltd., Hsin-Chu (TW)

(72) Inventors: Cheng-Ming Lin, Hsinchu (TW); Kai Tak Lam, Hsinchu (TW); Sai-Hooi Yeong, Hsinchu County (TW); Chi On Chui, Hsinchu (TW); Ziwei Fang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/218,151

(22) Filed: Dec. 12, 2018

(65) Prior Publication Data

US 2020/0127111 A1    Apr. 23, 2020

Related U.S. Application Data

(60) Provisional application No. 62/748,001, filed on Oct. 19, 2018.

(51) Int. Cl.
| | | |
|---|---|---|
| H01L 21/00 | (2006.01) | |
| H01L 29/51 | (2006.01) | |
| H01L 29/49 | (2006.01) | |
| H01L 29/66 | (2006.01) | |
| H01L 29/78 | (2006.01) | |
| H01L 21/28 | (2006.01) | |
| H01L 21/768 | (2006.01) | |

(52) U.S. Cl.
CPC ...... *H01L 29/516* (2013.01); *H01L 21/28088* (2013.01); *H01L 21/76829* (2013.01); *H01L 29/40111* (2019.08); *H01L 29/4966* (2013.01); *H01L 29/517* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,349,833 B1* | 5/2016 | Hung | H01L 29/4983 |
| 9,978,868 B2 | 5/2018 | Lai et al. | |
| 2003/0157766 A1* | 8/2003 | Uchiyama | H01L 21/3105 |
| | | | 438/240 |
| 2018/0337055 A1* | 11/2018 | Yamaguchi | H01L 21/02197 |

* cited by examiner

*Primary Examiner* — Reema Patel
(74) *Attorney, Agent, or Firm* — Haynes and Boone, LLP

(57) ABSTRACT

A method of forming a semiconductor device includes forming a hafnium-containing layer over a semiconductor layer, simultaneously performing a thermal annealing process and applying an electrical field to the hafnium-containing layer to form a ferroelectric hafnium-containing layer, and forming a gate electrode over the ferroelectric hafnium-containing layer.

20 Claims, 15 Drawing Sheets

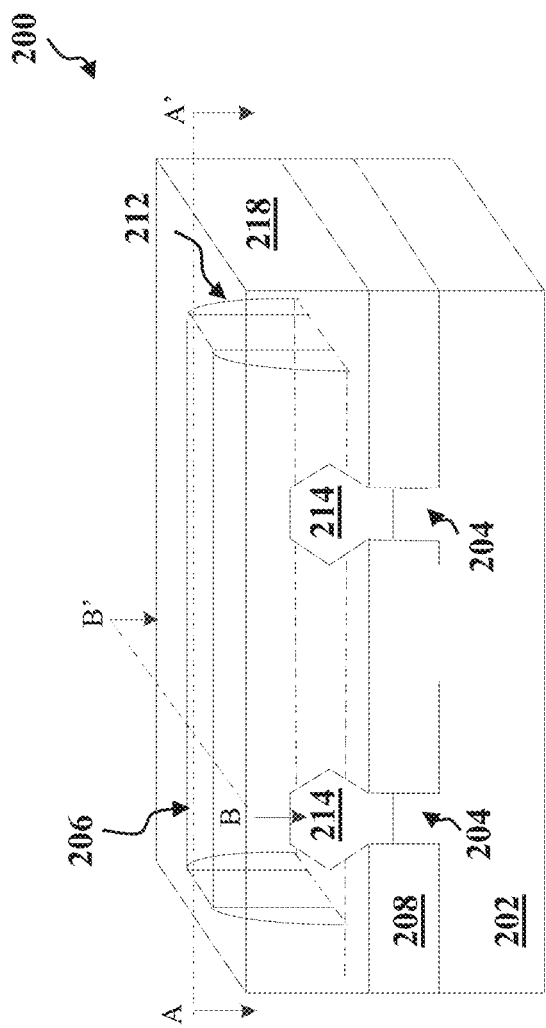
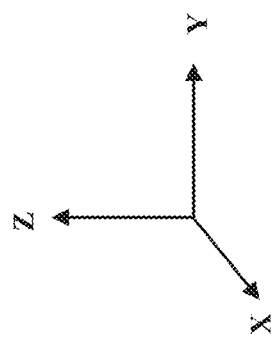
FIG. 2

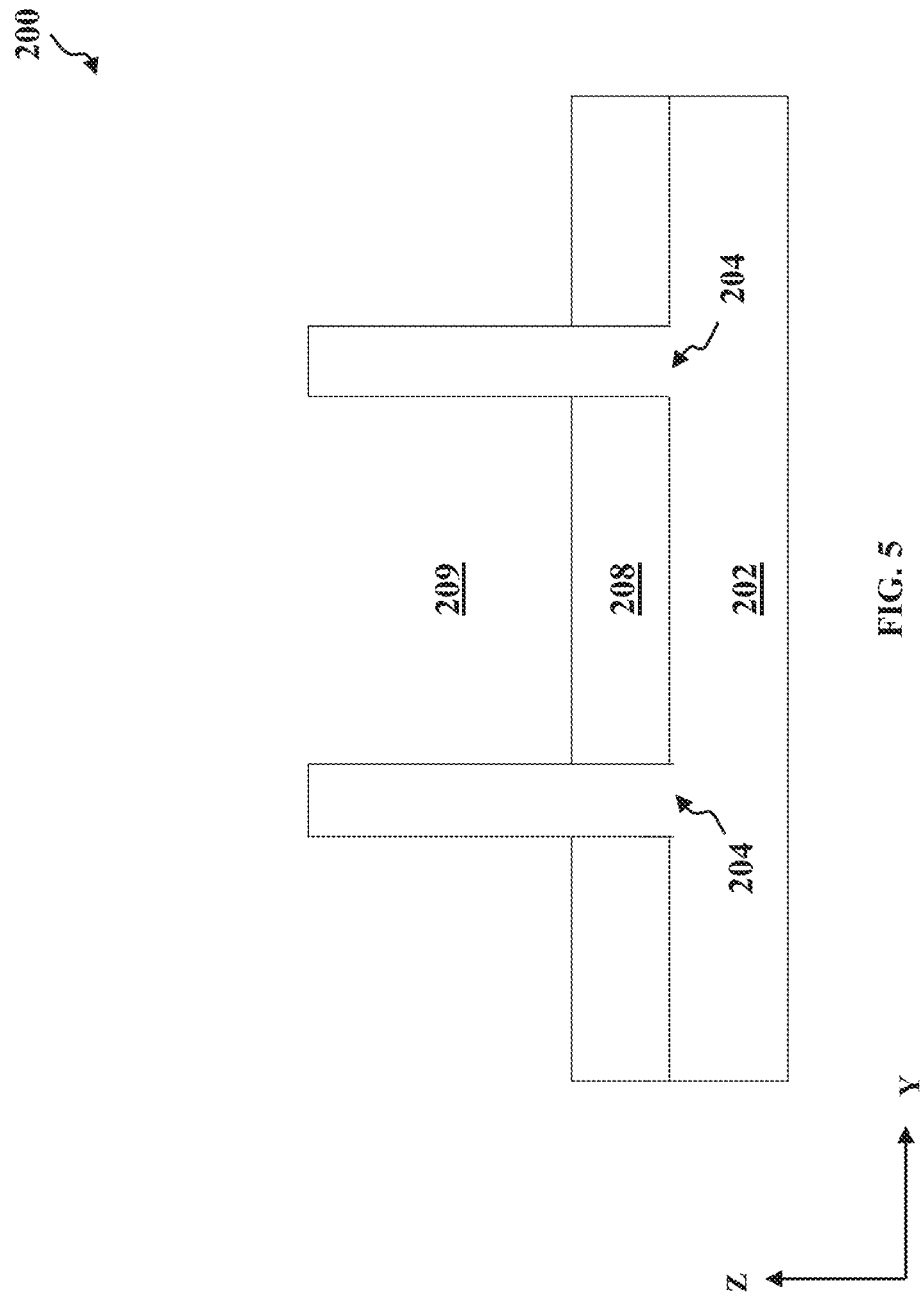

FIELD EFFECT TRANSISTORS WITH FERROELECTRIC DIELECTRIC MATERIALS

BACKGROUND CROSS-REFERENCE

This application claims priority to U.S. Provisional Patent Application Ser. No. 62/748,001 entitled "Field Effect Transistors with Ferroelectric Dielectric Materials" and filed on Oct. 19, 2018, the entire disclosure of which is incorporated herein by reference.

BACKGROUND integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, polysilicon gates have been replaced by high-k metal gates (HKMGs) in an effort to improve device performance with decreased feature size. Although methods for forming HKMGs have been generally adequate, they have not been entirely satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 illustrates a three-dimensional perspective view of an example semiconductor device in accordance with some embodiments of the present disclosure.

FIGS. 4, 5, 6A, 6B, 8, 10, 11, 12, and 13 illustrate cross-sectional views of the semiconductor device of FIG. 2 taken along line AA' at various stages of the method of FIG. 1 in accordance with some embodiments of the present disclosure.

DETAILED DESCRIPTION

Figure 1:
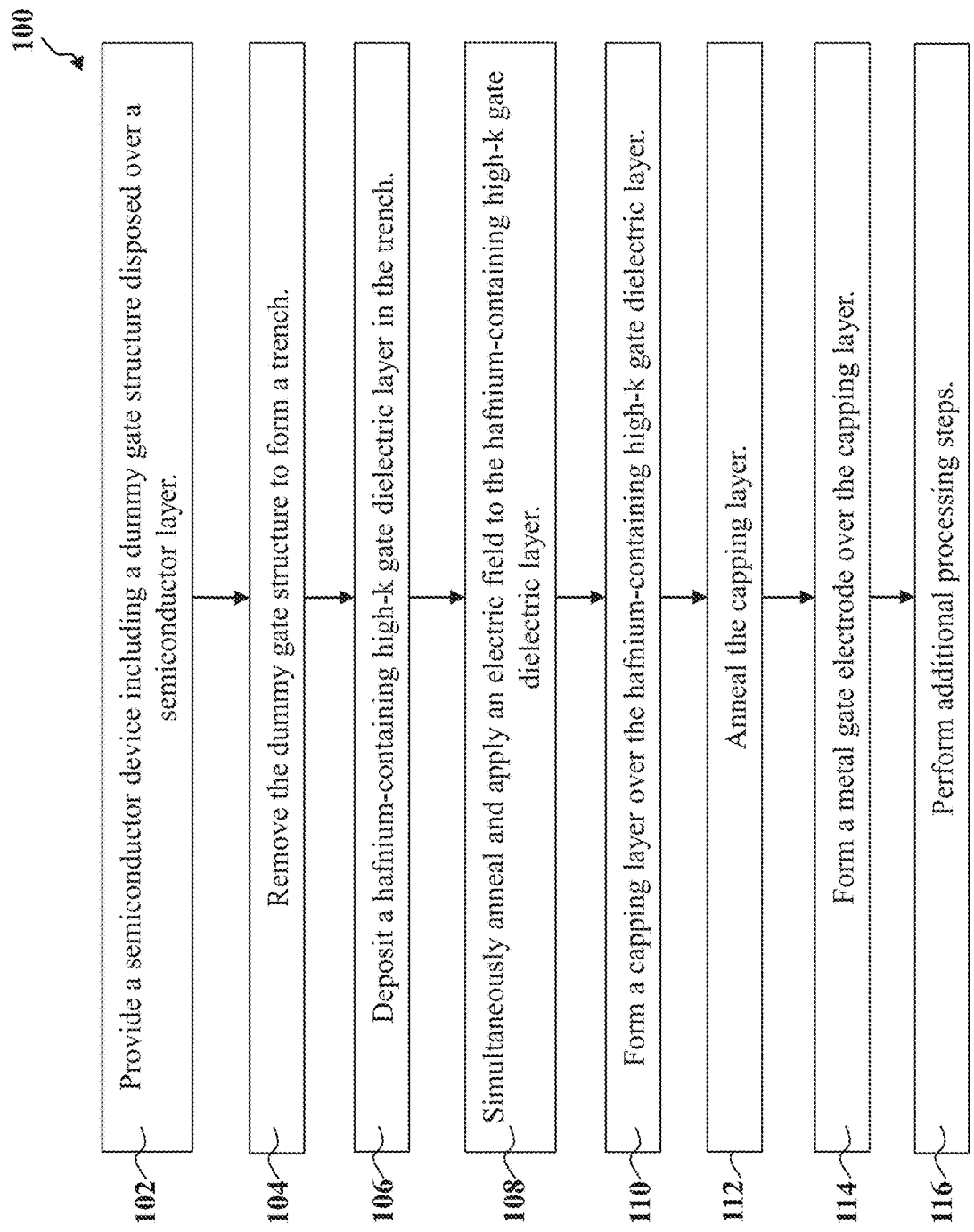
FIG. 1 is a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating high-k metal gates (HKMGs) in semiconductor devices, such as field-effect transistors (FETs). Throughout the present disclosure, "high-k" refers to a gate dielectric material having a dielectric constant k greater than that of silicon oxide, which is approximately 3.9.

Embodiments such as those described herein provide methods of forming HKMGs having a metal gate electrode disposed over a ferroelectric high-k gate dielectric layer. In particular, the present disclosure provides methods of transforming an amorphous hafnium-based high-k dielectric material into a ferroelectric orthorhombic phase during fabrication of the HKMGs. Generally, ferroelectric high-k dielectric materials have been employed to allow devices (e.g., FETs) to operate in a negative capacitance regime (e.g., in a negative-capacitance FET, or NCFET) for improved device performance. In one such example, ferroelectric high-k dielectric materials allow formation of FETs with reduced subthreshold swing (SS). SS generally describes the amount of voltage required to switch a device on and off, and thus influences the operating speed of the device. In many instances, other factors being constant, a reduction in SS generally increases a switching speed of an FET. SS may be controlled by the degree of ferroelectricity of a gate dielectric material included in a gate stack, with a higher ferroelectricity correlating to a lower SS. In addition, ferroelectric high-k dielectric materials may also enlarge the memory window for improved performance of nonvolatile memory devices. Notably, dielectric materials having similar compositions (e.g., all hafnium-based high-k dielectric material) may possess different degrees of ferroelectricity depending upon their specific crystalline phases (distinguished by different space groups, for example). In the example of hafnium-based high-k dielectric material, such as $HfO_2$, ferroelectric orthorhombic phase $Pca2_1$ possesses greater ferroelectricity than its counterpart orthorhombic phases. While methods of producing hafnium-based high-k dielectric materials with enhanced ferroelectricity (e.g., orthorhombic phase $Pca2_1$) have generally been adequate, they have not been entirely satisfactory in all respects, especially as devices continue to decrease in size.

Figure 3:
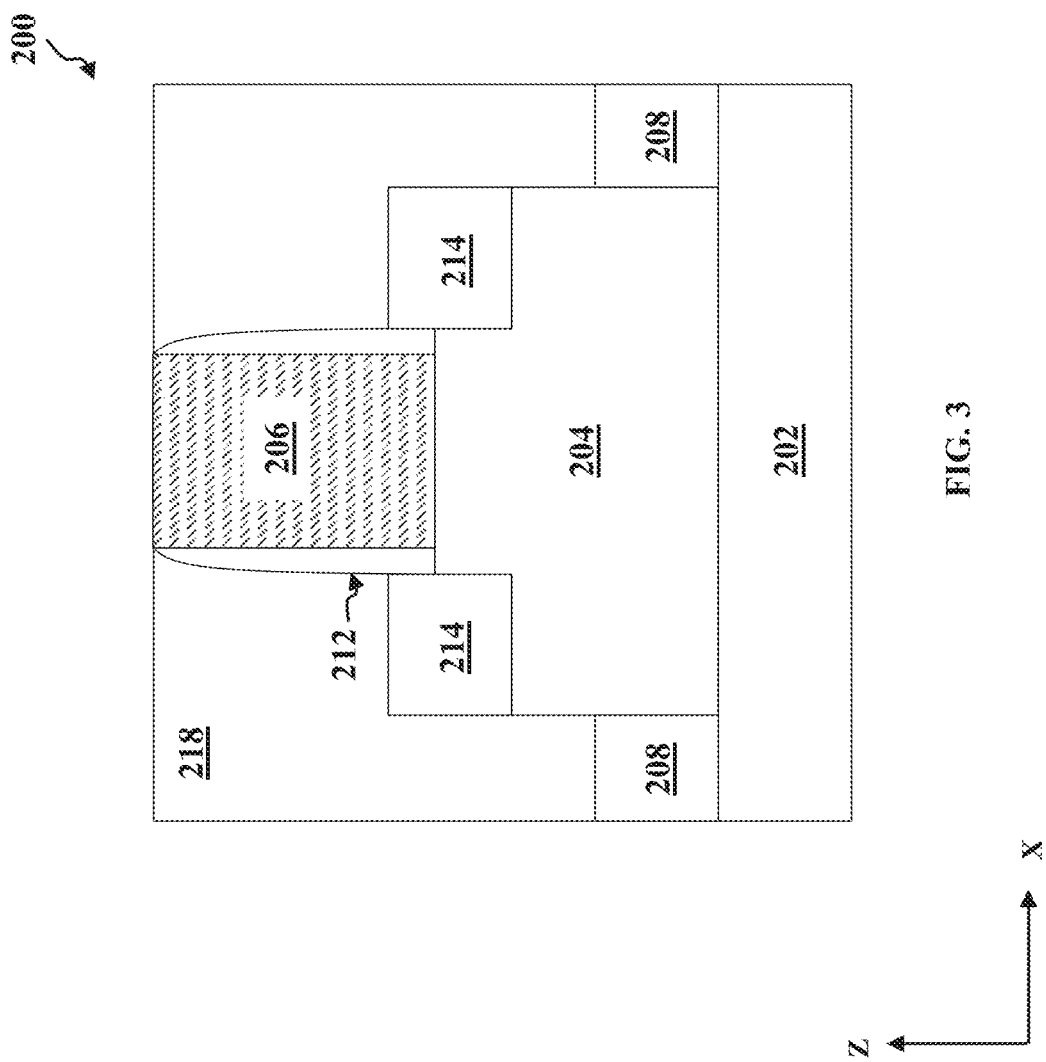
FIGS. 3 and 14 illustrate cross-sectional views of the semiconductor device of FIG. 2 taken along line BB' at various stages of the method of FIG. 1 in accordance with some embodiments of the present disclosure.
Figure 4:
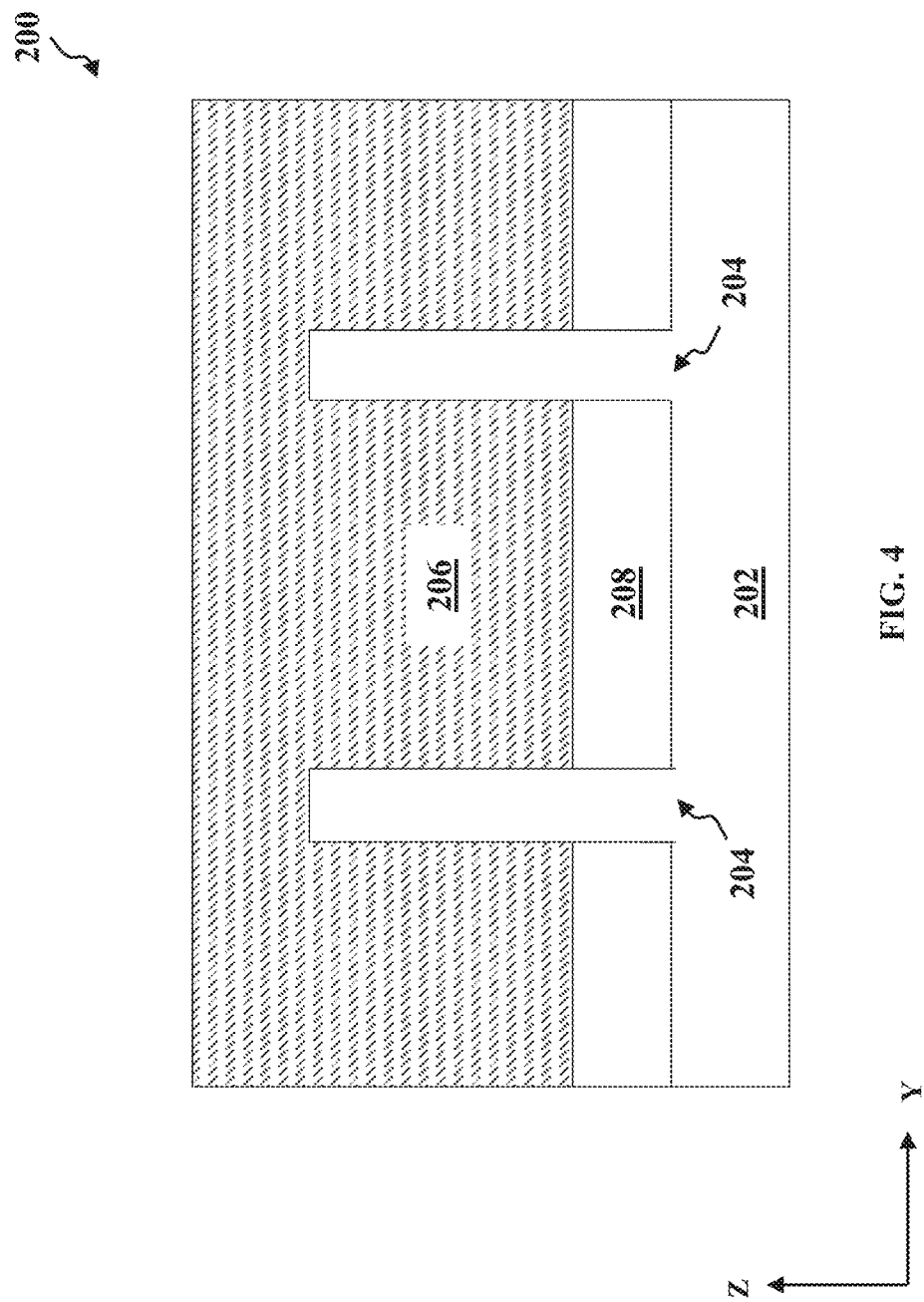

FIG. 1 illustrates a flow chart of a method 100 for forming a semiconductor device (hereafter referred to as "device") 200 in accordance with some embodiments of the present disclosure. The method 100 is merely an example and is not intended to limit the present disclosure beyond what is explicitly recited in the claims. Additional operations can be performed before, during, and after the method 100, and some operations described can be replaced, eliminated, or moved around for additional embodiments of the method. The method 100 is described below in conjunction with FIGS. 2-6B, 8, and 10-14, which illustrate various three-dimensional and cross-sectional views of the device 200 during intermediate steps of the method 100. In particular, FIG. 2 illustrates a three-dimensional view of the device 200, while FIGS. 2-6B, 8, and 10-14 illustrate cross-sectional views of the device 200 taken along line AA' as shown in FIG. 2, and FIGS. 3 and 14 illustrate cross-sectional views of the device 200 taken along line BB' as shown in FIG. 2.

The device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET device, the present disclosure may also provide embodiments for fabricating planar FET devices.

Referring to FIGS. 1-4, the method 100 at operation 102 provides the device 200 that includes one or more fins 204 protruding from a substrate 202 and separated by isolation structures 208, a dummy gate stack 206 disposed over the fins 204, gate spacers 212 disposed on sidewalls of the dummy gate stack 206, epitaxial source/drain (S/D) features 214 disposed over the fins 204, and an interlayer dielectric (ILD) layer 218 disposed over the isolation structures 208 and the epitaxial S/D features 214.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with p-type dopants, such as boron or $BF_2$, and/or n-type dopants, such as phosphorus or arsenic, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Each fin 204 may be suitable for providing an n-type FinFET or a p-type FinFET. In some embodiments, the fins 204 as illustrated herein may be suitable for providing FinFETs of a similar type, i.e., both n-type or both p-type. Alternatively, they may be suitable for providing FinFETs of opposite types, i.e., an n-type and a p-type. This configuration is for illustrative purposes only and is not intended to be limiting. The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

In many embodiments, the dummy gate stack 206 is provided as a placeholder for an HKMG and may include a dummy gate electrode comprising polysilicon. The dummy gate stack 206 may additionally include other material layers disposed between the dummy gate electrode and the fins 204. For example, the dummy gate stack may include an interfacial layer (not depicted) and/or a dummy gate dielectric layer (not depicted). As will be discussed in detail below, portions of the dummy gate stack 206 are replaced with the HKMG during a gate replacement process after other components (e.g., the epitaxial S/D features 214) of the device 200 are fabricated. Various material layers of the dummy gate stack 206 may be formed by any suitable process, such as CVD, PVD, ALD, chemical oxidation, other suitable processes, or combinations thereof.

The device 200 further includes gate spacers 212 disposed on sidewalls of the dummy gate stack 206. The gate spacers 212 may include a dielectric material, such as silicon oxide, silicon nitride, silicon carbide, silicon oxynitride, other suitable dielectric materials, or combinations thereof. The gate spacers 212 may be a single layered structure or a multi-layered structure. The gate spacers 212 may be formed by first depositing a blanket of spacer material over the device 200, and then performing an anisotropic etching process to remove portions of the spacer material to form the gate spacers 212 on sidewalls of the dummy gate stack 206. In the present disclosure, the gate spacers 212 remain as portions of the device 200 during the subsequent gate replacement process.

Collectively referring to FIGS. 2 and 3, the device 200 includes epitaxial S/D features 214 disposed over the fins 204 and adjacent to the dummy gate stack 206. The epitaxial S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the epitaxial S/D features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

Additionally, the device 200 includes the ILD layer 218, and optionally a contact etch-stop layer (CESL; not depicted), disposed over the substrate 202. In some embodiments, the ILD layer 218 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 218 may include a multi-layer structure having multiple dielectric materials and may be formed by a deposition process such as, for example, CVD, flowable CVD (FCVD), spin-on-glass (SOG), other suitable methods, or combinations thereof. In some embodiments, forming the ILD layer 218 further includes performing a CMP process to planarize a top surface of the device 200, such that a top surface of the dummy gate stack 206 is exposed. The CESL may comprise silicon nitride, silicon oxynitride, silicon nitride with oxygen or carbon elements, other suitable materials, or combinations thereof, and may be formed by CVD, PVD, ALD, other suitable methods, or combinations thereof.

Now referring to FIGS. 1 and 5, the method 100 at operation 104 removes the dummy gate stack 206 to form a gate trench 209. In the depicted embodiment, the gate trench 209 exposes portions of the fins 204 and the isolation structures 208. The method 100 at operation 104 may include one or more etching processes that are selective to the materials included in the dummy gate stack 206 (e.g., the polysilicon included in the gate electrode of the dummy gate stack 206). The etching processes may include dry etching, wet etching, RIE, or other suitable etching methods, or combinations thereof.

Figure 6A:
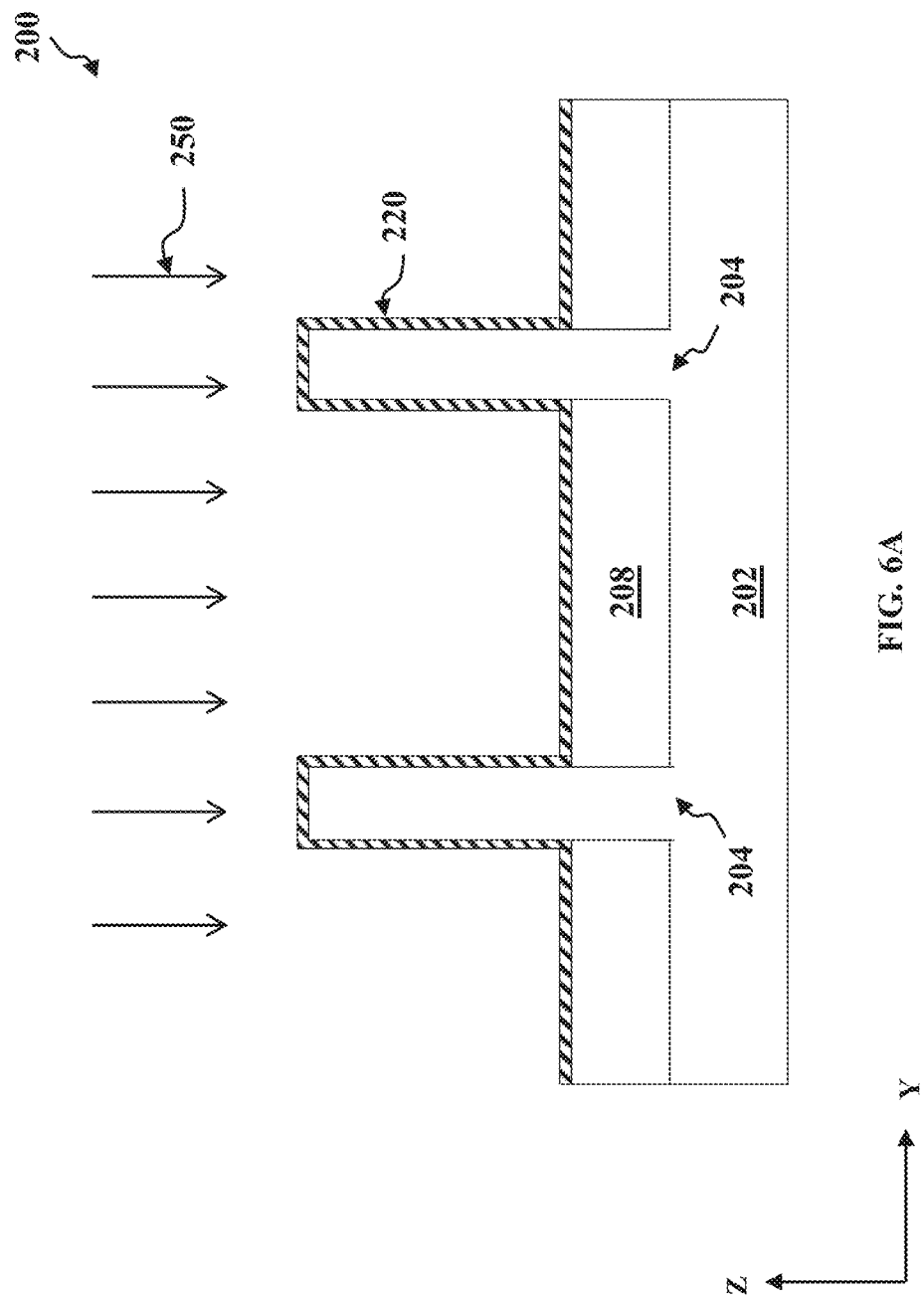

Referring to FIGS. 1 and 6A, the method 100 at operation 106 forms a high-k gate dielectric layer 220 in the gate trench 209 in a deposition process 250. The high-k gate dielectric layer 220 includes at least one high-k dielectric material comprising hafnium (Hf) and oxygen (O) in the form of, for example, hafnium oxide (e.g., HfO2). Therefore, in the present disclosure, the high-k gate dielectric layer 220 may alternatively be referred to as the Hf-containing gate dielectric layer 122. As discussed above, "high-k" refers to a dielectric constant being greater than that of silicon oxide, which is about 3.9. In many examples, an amount (by wt %) of HfO2 included in the high-k gate dielectric layer 220 ranges from about 30% to about 100%. In further embodiments, the high-k gate dielectric layer 220 is doped with one or more dopant including, but not limited to, zirconium (Zr), aluminum (Al), lathanum (La), titanium (Ti), tantalum (Ta), silicon (Si), yttrium (Y), scandium (Sc), other suitable elements, or combinations thereof.

The high-k gate dielectric layer 220 may be formed by any suitable deposition process including ALD, CVD, PVD, other processes, or combinations thereof. In the depicted embodiment, the high-k gate dielectric layer 220 is deposited in the gate trench 209 by an ALD process to a thickness of about 1 nm to about 10 nm. Although other thicknesses greater than 10 nm may also be applicable to embodiments of the present disclosure, a thickness of the high-k gate dielectric layer 220 is desired to be minimized in order to meet design requirements for reduced feature sizes. In some examples, the deposition of the high-k gate dielectric layer 220 may be performed at a temperature of about 150 degrees C. to about 500 degrees C. depending upon the specific layer thickness desired and/or if any dopant(s) is included. In some examples, the deposition of the high-k gate dielectric layer 220 may be formed at a gas pressure of about 0.5 Torr to about 3 Torr depending upon the specific layer thickness desired and/or if any dopant(s) is included.

The high-k gate dielectric layer 220 may optionally include other high-k dielectric material, such as alumina (Al2O3), zirconium oxide (ZrO2), lanthanum oxide (La2O3), titanium oxide (TiO2), yttrium oxide (Y2O3), other suitable high-k materials, or combinations thereof. In some embodiments, the high-k gate dielectric layer 220 may include a perovskite material, such as lead zirconate titanate (PbZrxTi1−xO3, or PZT, where 0≤x≤1), barium titanate (BaTiO3), barium strontium titanate (BaSrTiOx, or BST), strontium titanate (SrTiO3), other suitable perovskite materials, or combinations thereof that are configured to undergo phase transition to acquire ferroelectric behavior.

In many embodiments, the as-deposited high-k gate dielectric layer 220 primarily includes amorphous HfO2 rather than crystalline HfO2. Besides amorphous HfO2, the as-deposited high-k gate dielectric layer 220 may also include a minute amount of microcrystals of HfO2, which does not exhibit any ferroelectric behavior. In one example, the as-deposited high-k gate dielectric layer 220 may include more than about 90% (by weight) of amorphous HfO2, and about 5% of the remainder may be crystalline HfO2 in monoclinic phase. As discussed above, in order for HfO2 to exhibit ferroelectric behavior and enable negative-capacitance, certain crystalline phases (e.g., ferroelectric orthorhombic phases) are desired. The ferroelectric orthorhombic phase provided herein may be designated by space group Pca21, which describes the relative positions of the Hf and O atoms arranged in an orthorhombic crystal structure. Although HfO2 may also transform into other orthorhombic phases, such as Pbca and Pnma, only Pca21 exhibits ferroelectric behavior suitable for forming NCFETs as discussed above. As such, the high-k gate dielectric layer 220 will exhibit ferroelectric behavior after undergoing phase transformation to form a ferroelectric orthorhombic phase, i.e., containing Pca21.

Generally, crystalline HfO2 in a high-k gate dielectric layer (e.g., the high-k gate dielectric layer 220) is obtained by thermally annealing the as-deposited HfO2 to enable rearrangement of atoms within the amorphous phase and to form crystalline HfO2. However, as device sizes continue to decrease, a reduced thickness of the high-k gate dielectric layer causes the energy barrier (e.g., activation energy for crystallization) required for phase transformation to increase, such that post-deposition thermal annealing alone energetically falls short in its ability to convert amorphous HfO2 to orthorhombic crystalline HfO2. In one such example, it has been observed that when the thickness of the high-k gate dielectric layer reduces to about 5 nm and below, no amount or only a minimal amount of ferroelectric orthorhombic HfO2 (i.e., containing Pca21) may be formed after performing the thermal annealing process. One explanation for such phenomenon may be the fact that as thickness reduces to length scales comparable to sizes of crystalline networks (e.g., within one order of magnitude in length scale), space available for grains of crystals to form becomes inevitably limited, thereby presenting a greater energy barrier for crystallization process to occur. Embodiments of the present disclosure are directed to methods of promoting transformation of amorphous HfO2 to crystalline HfO2, and more specifically, to crystalline HfO2 in a ferroelectric orthorhombic phase, at reduced length scales. In some embodiments, as will be discussed in detail below, methods of the present disclosure enhance an amount of ferroelectric orthorhombic HfO2 formed in the high-k gate dielectric layer 220 by applying an electric field while performing a thermal annealing process. In an example embodiment, the amount of ferroelectric orthorhombic phase is at least about 60% by weight.

Figure 6B:
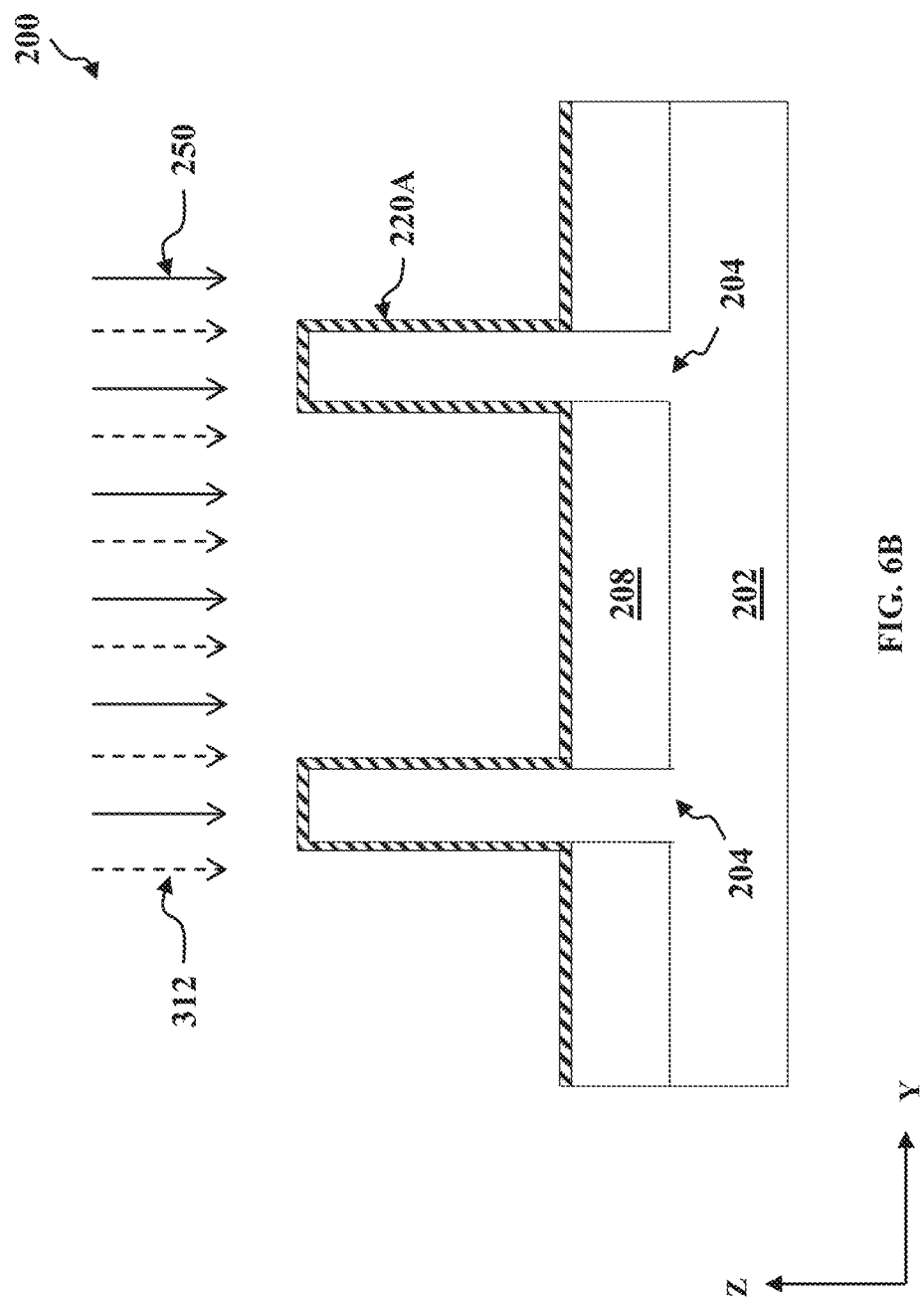
Figure 7A:
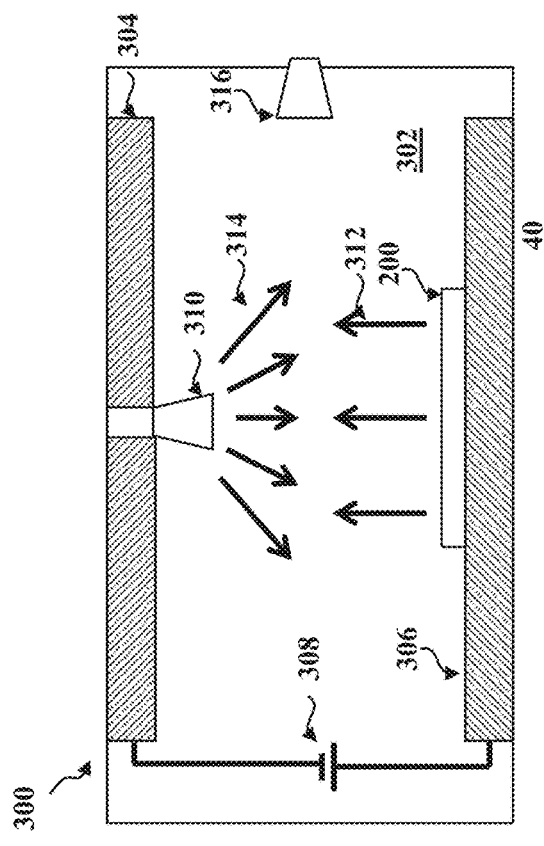
FIGS. 7A and 7B illustrate embodiments of an example apparatus in accordance with some embodiments of the present disclosure.
Figure 7B:
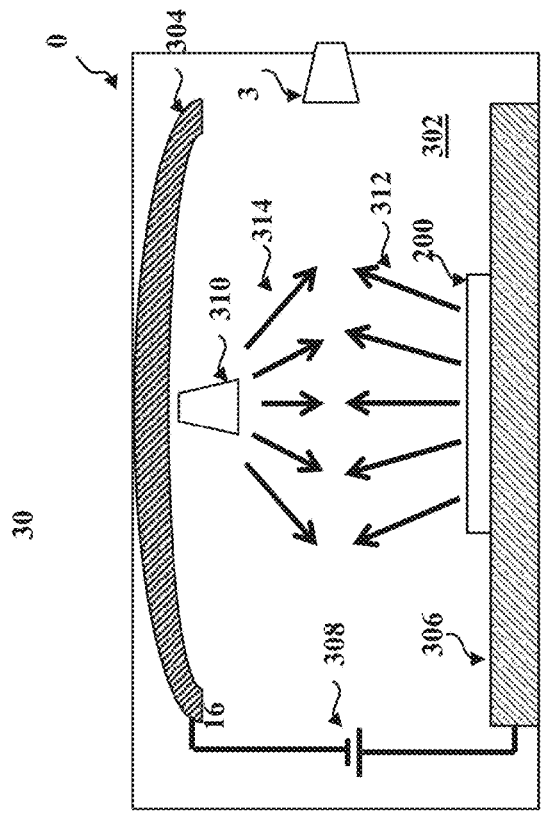

Referring to FIG. 6B, the method 100 at operation 106 may optionally apply an electric field 312 to the device 200 while depositing the high-k gate dielectric layer 220. In some embodiments, the in-situ application of the electric field 312 is performed in the same deposition chamber. Referring to FIGS. 7A and 7B, a deposition apparatus 300 is provided as an example embodiment in which the deposition of the high-k gate dielectric layer 220 and/or the application of the electric field 312 is implemented.

The deposition apparatus 300 includes a chamber 302 configured with two electrodes: a top electrode 304 and a bottom electrode 306. In some embodiments, the bottom electrode 306 includes an electrostatic chuck (or E-chuck) upon which the device 200 is disposed. Alternatively or additionally, the bottom electrode 306 may include a susceptor, which is configured to heat the device 200 disposed thereon to an elevated temperature using, for example, infrared radiation. In some embodiments, referring to FIG. 7A, the top electrode 304 and the bottom electrode 306 are configured to be substantially parallel. However, the present disclosure is not limited to this configuration and may also be applicable in instances where the top electrode 304 and/or the bottom electrode 306 is configured with a curvature (e.g., FIG. 7B), such as in a concave, convex, spiral, or other suitable configurations. In some examples, spacing between the top electrode 304 and the bottom electrode 306 ranges from about 5 cm to about 50 cm; though other spacings may also be applicable in order to accommodate different configurations and sizes of the deposition apparatus 300. The top electrode 304 and the bottom electrode 306 may include any suitable metal or ceramic materials operable to be heated to a desired temperature (e.g., from about 150 degrees Celsius to about 500 degrees Celsius as discussed above). The deposition apparatus 300 may further include a gas inlet 316 and a gas outlet (not depicted) for providing one or more gas, inert or otherwise, during deposition, temperature monitoring device(s), and/or other suitable components. In some examples, gases such as nitrogen (N2), argon (Ar), ammonia (NH3), oxygen (O2), other suitable gases, or combinations thereof may be provided to the chamber 302 via the gas inlet 316.

Referring to both FIGS. 7A and 7B, the top electrode 304 and the bottom electrode 306 are coupled to a power source 308, which may be disposed inside the chamber 302 as depicted herein or, alternatively, disposed outside the chamber 302. When the power source 308 is switched on, the top electrode 304 and the bottom electrode 306 may be oppositely charged such that an electric field 312 is established therebetween. For embodiments in which the top electrode 304 and the bottom electrode 306 are substantially parallel to each other (FIG. 7A), a direction of the electric field 312 may be substantially unidirectional, such as substantially perpendicular to both the top electrode 304 and the bottom electrode 306. Alternatively, referring to FIG. 7B, the direction of the electric field 312 may be multidirectional, i.e., the electric field 312 does not align along a single direction. In some embodiments, the electric field 312 is a direct-current (DC) electric field. In alternative embodiments, the electric field 312 is an alternating-current (AC) electric field. Furthermore, the polarity of the electrodes 304 and 306 may be reversed for applications of the present disclosure. In some examples, the voltage supplied by the power source 308 is from about 2 kV to about 10 kV; though other voltage may also be applicable in the present disclosure. During the deposition process 250, a source material 314 is discharged into the chamber 302 through a dispensing unit 310 and deposited a top surface (e.g., in the gate trench 209) of the device 200. In the depicted embodiment, the source material 314 includes one or more precursor gas suitable for forming HfO2. However, the present disclosure is not limiting with respect to the kinds of precursor gas that may be used herein. For example, the precursor gas may include an Hf-containing metalorganic gas, an Hf-containing halide gas, other suitable gases, or combinations thereof.

As provided herein, the method 100 at operation 106 may implement only the deposition process 250 (FIG. 6A), or alternatively, simultaneously implement the deposition process 250 and the electric field 312 (FIG. 6B). In some embodiments, when the dispensing unit 310 releases the source material 314 to deposit the high-k gate dielectric layer 220, the simultaneous application of the electric field 312 provides energy to mobilize O atoms relative to Hf atoms toward lattice positions compatible with the ferroelectric orthorhombic crystal structure. In some instances, energy provided by the electric field 312 may be utilized to control the amount of oxygen vacancies present in the crystal structure. In some embodiments, a suitable amount of oxygen vacancies helps facilitate the phase transition to crystalline phases with high symmetry, such as tetragonal and cubic phases, and induce metastable polar phases at the boundary of such phases. However, an excessive amount of oxygen vacancies may instead favor less symmetric crystalline phases that do not exhibit ferroelectric properties. As a result, though not required, it may offer advantage for the overall yield of the ferroelectric orthorhombic phase to apply an electric field during the deposition of the high-k gate dielectric layer 220, resulting in a high-k gate dielectric layer 220A that includes microstructures different (e.g., having less oxygen vacancies) from those of the as-deposited high-k gate dielectric layer 220. Though not required by the present disclosure, elements such as nitrogen (N) (e.g., in the form of an inert gas provided during the deposition process 250) may passivate the oxygen vacancies, further promoting the phase transformation as discussed herein. It is noted, however, that the energy provided by the electric field 312 during the deposition process at the operation 106 is generally not sufficient to complete the transformation of amorphous HfO2 to ferroelectric orthorhombic crystalline HfO2.

In some embodiments, the method 100 optionally forms an interfacial layer (not depicted) in the gate trench 209 before depositing the high-k gate dielectric layer 220. The interfacial layer may include a semiconductor oxide (e.g., silicon oxide) formed by a suitable technique, such as ALD, thermal oxidation, or UV-ozone oxidation. The interfacial layer may have a thickness less than about 10 Angstrom.

Figure 7C:
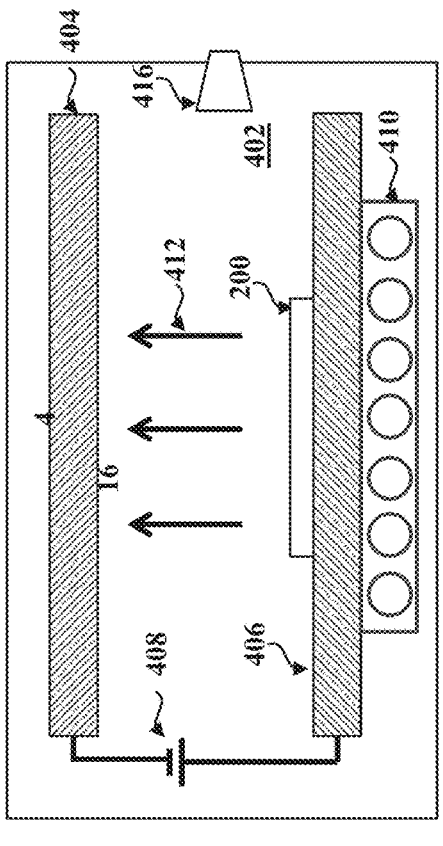
FIGS. 7C and 7D illustrate embodiments of an example apparatus in accordance with some embodiments of the present disclosure.
Figure 7D:
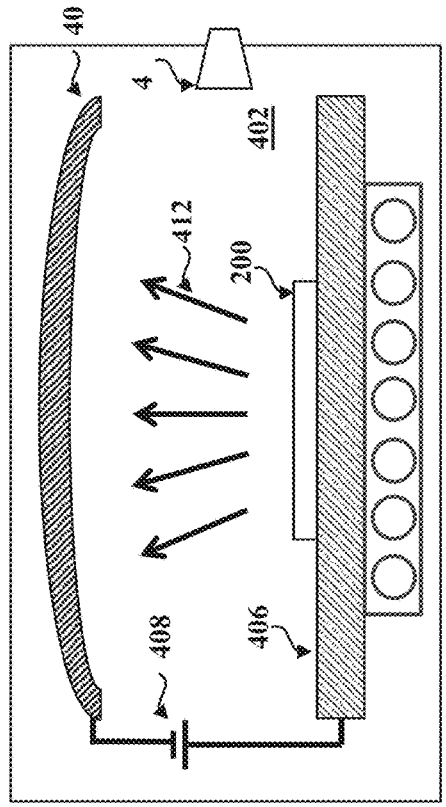
Figure 8:
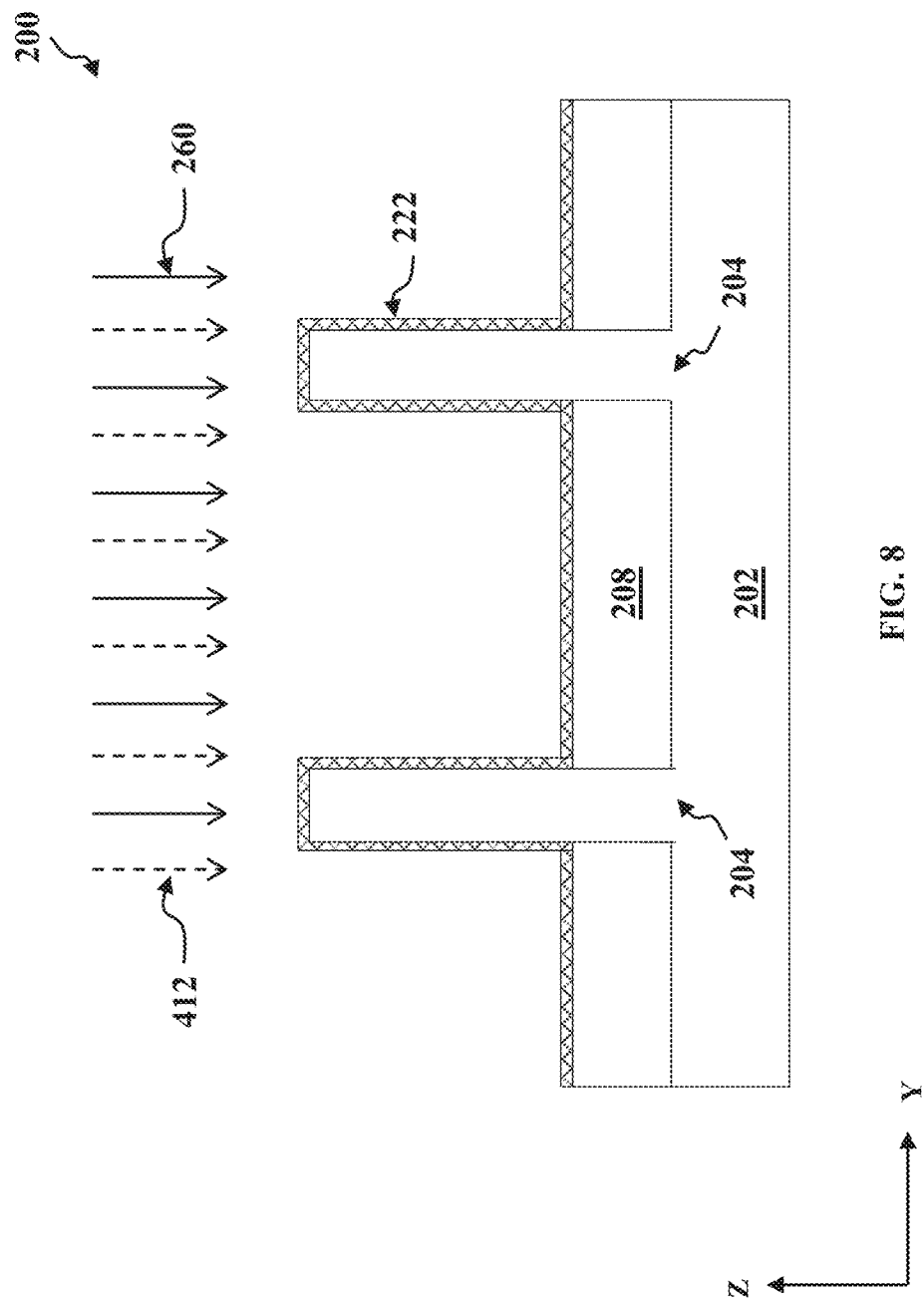

Now referring to FIGS. 1 and 8, the method 100 at operation 108 simultaneously performs an annealing process 260 and applies an electric field 412 to the high-k gate dielectric layer 220, resulting in a high-k gate dielectric layer 222. The operation 108 is discussed in detail below with respect to FIGS. 7C and 7D.

Referring to FIGS. 7C and 7D, illustrated are example embodiments of an annealing apparatus 400 in which the operation 108 may be implemented. The annealing apparatus 400 includes a chamber 402 configured with two electrodes: a top electrode 404 and a bottom electrode 406, which may be similar in configuration and/or in material composition as the top electrode 304 and the bottom electrode 306 discussed above with respect to the deposition apparatus 300. For example, the top electrode 404 and the bottom electrode 406 may be configured to be substantially parallel as depicted in FIG. 7C or, alternatively, the top electrode 404 and/or the bottom electrode 406 may be configured with a curvature as depicted in FIG. 7D. The annealing apparatus 400 may additionally or alternatively include a heating source 410 disposed below and in contact with the bottom electrode 406. The heating source 410 may include a susceptor as discussed above configured to heat the device 200 disposed thereover to an elevated temperature during the annealing process 260. In some embodiments, the bottom electrode 406 and the heating source 410 may be a single, unified component. Alternatively, the bottom electrode 406 and the heating source 410 may be configured to be separate components. The annealing apparatus 400 may include additional components, such as a gas inlet 416, which may be similar to the gas inlet 316 depicted in FIGS. 7A and 7B, and a gas outlet (not depicted), other suitable components, or combinations thereof. Gases such as nitrogen (N2), argon (Ar), ammonia (NH3), other suitable gases, or combinations thereof may be applied to the device 200 during the annealing process 260.

Similar to the descriptions of FIGS. 7A and 7B, the top electrode 404 and the bottom electrode 406 are coupled to a power source 408. When the power source 408 is switched on, the top electrode 404 and the bottom electrode 406 may be oppositely charged such that an electric field 412 is established therebetween. In some embodiments, the electric field 412 is a direct-current (DC) electric field. In alternative embodiments, the electric field 412 is an alternating-current (AC) electric field. Furthermore, the polarity of the electrodes 404 and 406 may be reversed for applications of the present disclosure. In some examples, the voltage supplied by the power source 408 is from about 2 kV to about 10 kV; though other voltage may also be applicable in the present disclosure. For embodiments in which the top electrode 404 and the bottom electrode 406 are substantially parallel to each other (FIG. 7C), a direction of the electric field 412 may be substantially unidirectional, such as substantially perpendicular to both the top electrode 404 and the bottom electrode 406. Alternatively, referring to FIG. 7D, the direction of the electric field 412 may be multidirectional, i.e., the electric field 412 does not align along a single direction.

In many embodiments, the mode by which the method 100 performs the annealing process 260 is not limiting so long as it provides sufficient energy to enable the transformation of amorphous HfO2 to ferroelectric orthorhombic crystalline HfO2. For example, the annealing process 260 may be a furnace annealing process, a rapid thermal annealing (RTA) process, a spike annealing process, a laser annealing process, other suitable annealing process, or combinations thereof. In an example embodiment, the annealing process 260 is an RTA process. In many embodiments, the annealing temperature implemented during the annealing process 260 ranges from about 600 degrees Celsius to about 1000 degrees Celsius. If the annealing temperature falls below about 600 degrees Celsius, the thermal energy available for completing the phase transformation may not be sufficient. On the other hand, if the annealing temperature is above about 1000 degrees Celsius, excessive heat may damage other components (e.g., S/D features, etc.) of the device 200. The annealing process 260 may be implemented for any suitable amount of time depending upon a specific annealing process employed. For example, if a high-temperature annealing process, such as a laser annealing process, is employed, the annealing time may be on the order of microseconds. On the other hand, if a low-temperature annealing process, such as a furnace annealing process, is employed, the annealing time may be on the order of tens of minutes.

Different from the operation 106 during which the electric field 312 may or may not be applied simultaneously with the deposition process 250, the method 100 at operation 108 applies the electric field 412 while performing the annealing process 260. And, in some embodiments, the electric field 412 may be implemented at a higher strength than the electric field 312. As discussed above, applying the electric field 312 during deposition of HfO2 at operation 106 provides energy for structural rearrangement of atoms within the structure of HfO2. One result of such rearrangement includes reduction the number of oxygen vacancies present in HfO2. However, the simultaneous application of the electric field 412 during the annealing process 260 generally serves a purpose different from that of the electric field 312 applied during the deposition process 250. As stated previously, the activation energy required (i.e., energy barrier that must be overcome) for crystallization of the ferroelectric orthorhombic phase increases as thickness of the high-k gate dielectric layer decreases. For at least this reason, thermal annealing alone, carried out at a temperature (from about 600 degrees Celsius to about 1000 degrees Celsius) high enough without causing damage to other components of the device, falls short in converting amorphous HfO2 to ferroelectric orthorhombic HfO2. In the present disclosure, the simultaneous application of the electric field 412 during the annealing process 260 is configured to overcome the activation energy required for crystallizing or transforming amorphous, as-deposited HfO2 in the high-k gate dielectric layer 220 (or 220A as depicted in FIG. 6B) to ferroelectric orthorhombic phase (i.e., Pca21 phase) of HfO2.

Figure 9:
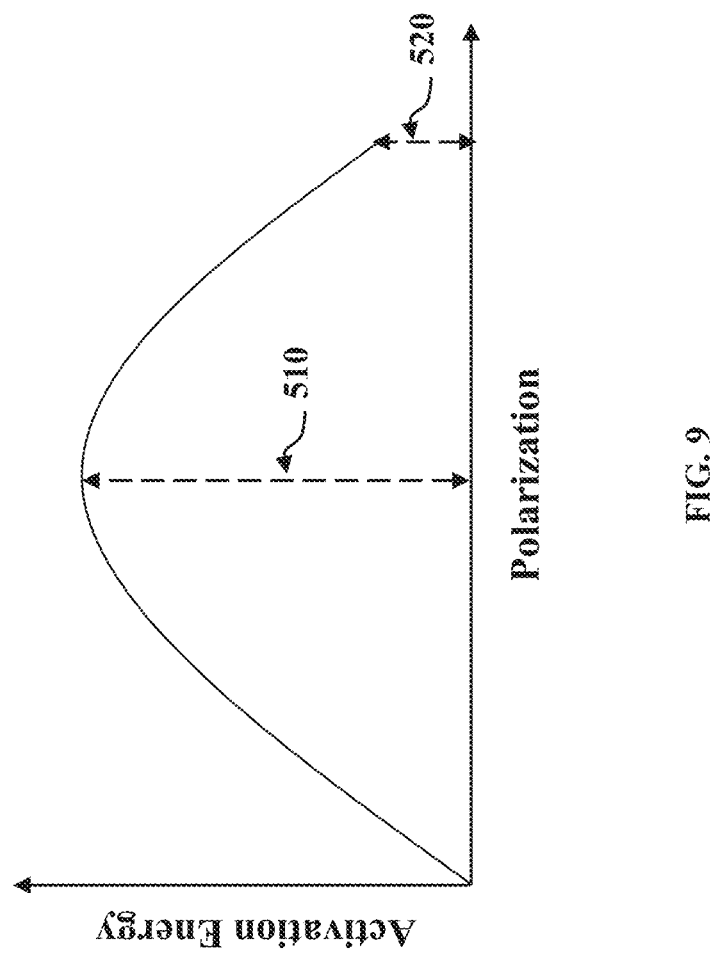
FIG. 9 is a schematic representation of an example phase transformation process in accordance with some embodiments of the present disclosure.

In some embodiments, the electric field 412 applied during the annealing process 260 provides sufficient energy to encourage the alignment of atoms during the crystallization process. FIG. 9 is a schematic illustration of the effect of applying an electric field (e.g., the electric field 412) on the activation energy required for phase transformation during the annealing process 260. As activation energy is plotted against polarization in the depicted graph, the activation energy 510 at the peak of the graph reflects the amount of energy needed to overcome the barrier for forming the ferroelectric orthorhombic phase of HfO2 without applying any electric field. On the other hand, the activation energy 520 represents the energy barrier against forming the ferroelectric orthorhombic phase of HfO2 when an electric field, such as the electric field 412, is applied during the annealing process 260. In the present disclosure, the activation energy 520 is less than the activation energy 510. In some examples, the activation energy 520 may be less than about 25% of the activation energy 510.

Figure 10:
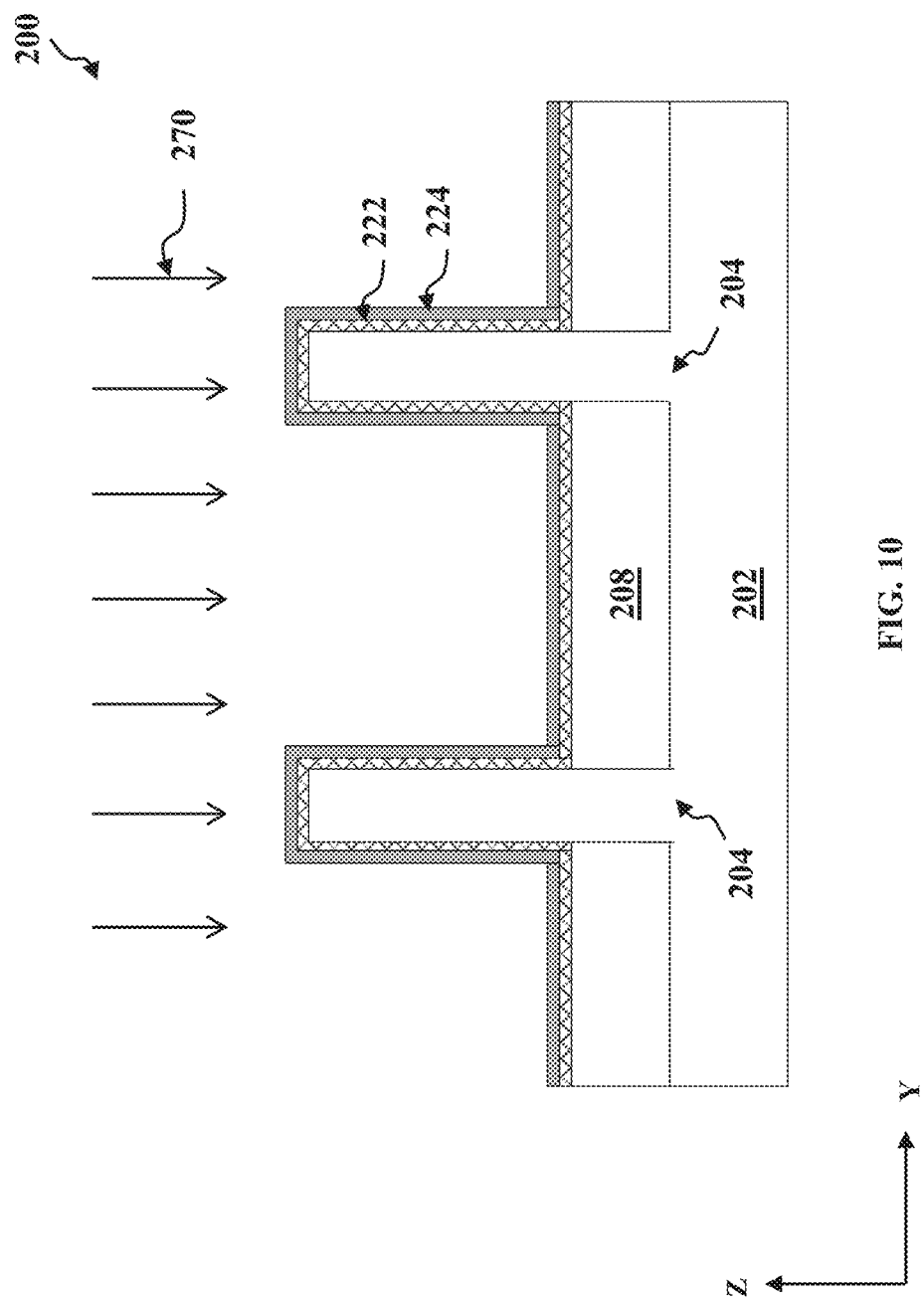

Now referring to FIGS. 1 and 10, the method 100 at operation 110 forms a capping layer 224 over the high-k gate dielectric layer 222, which now includes ferroelectric orthorhombic HfO2 as discussed above, during a deposition process 270. The capping layer 224 may include any suitable material, such as a titanium-containing material, a tantalum-containing material, a nitrogen-containing material, a silicon-containing material, other suitable materials, or combinations thereof. For example, the capping layer 224 may include titanium nitride (TiN), tantalum nitride (TaN), titanium silicide (TiSi), other suitable materials, or combinations thereof. The capping layer 224 may be configured to protect the underlying high-k gate dielectric layer 222 against subsequent fabrication steps and is generally chemically inert toward the high-k gate dielectric layer 222. The deposition process 270 may be implemented by any suitable method, such as CVD, ALD, PVD, other suitable methods, or combinations thereof. In some examples, the capping layer is formed by an ALD process to a thickness of about 10 angstrom to about 30 angstrom. Of course, other thicknesses may also be applicable to the present disclosure depending upon specific design requirements.

Figure 11:
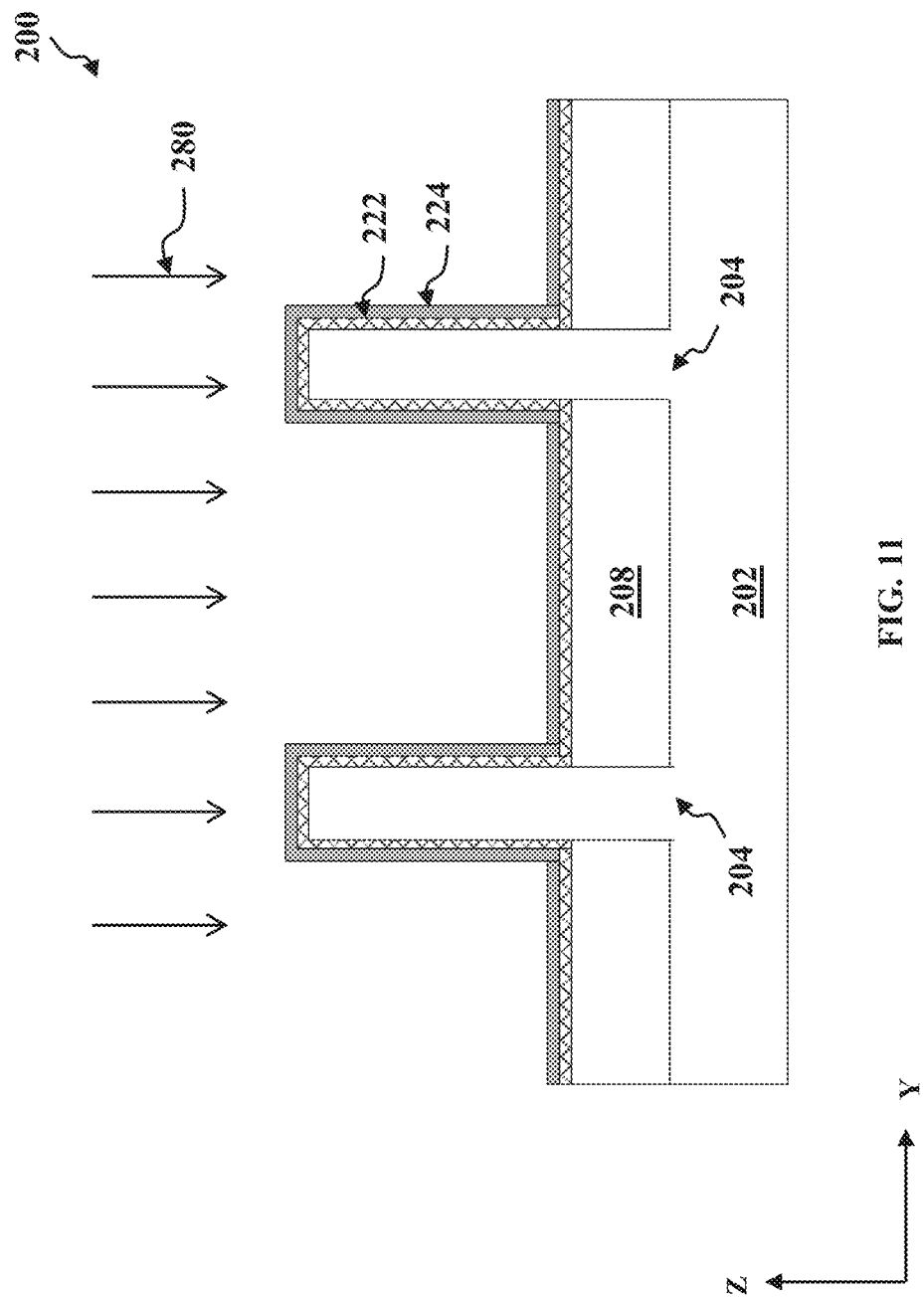

Referring to FIGS. 1 and 11, the method 100 at operation 112 performs an annealing process 280 to the capping layer 224. In some examples, the annealing process 280 may be performed at a temperature of about 600 degrees Celsius to about 950 degrees Celsius and may be implemented by any suitable method, such as furnace annealing, RTA, spike annealing, laser annealing, other suitable annealing methods, or combinations thereof. In many embodiments, the annealing process 280 is configured to relieve thermal stress built up within the capping layer 224 during the deposition process 270. In alternative embodiments, the annealing process 280 at operation 112 is omitted. Similar to the annealing process 260 discussed above, the annealing time for implementing the annealing process 270 may vary from microseconds to tens of minutes depending upon the specific type of annealing process employed.

Figure 12:
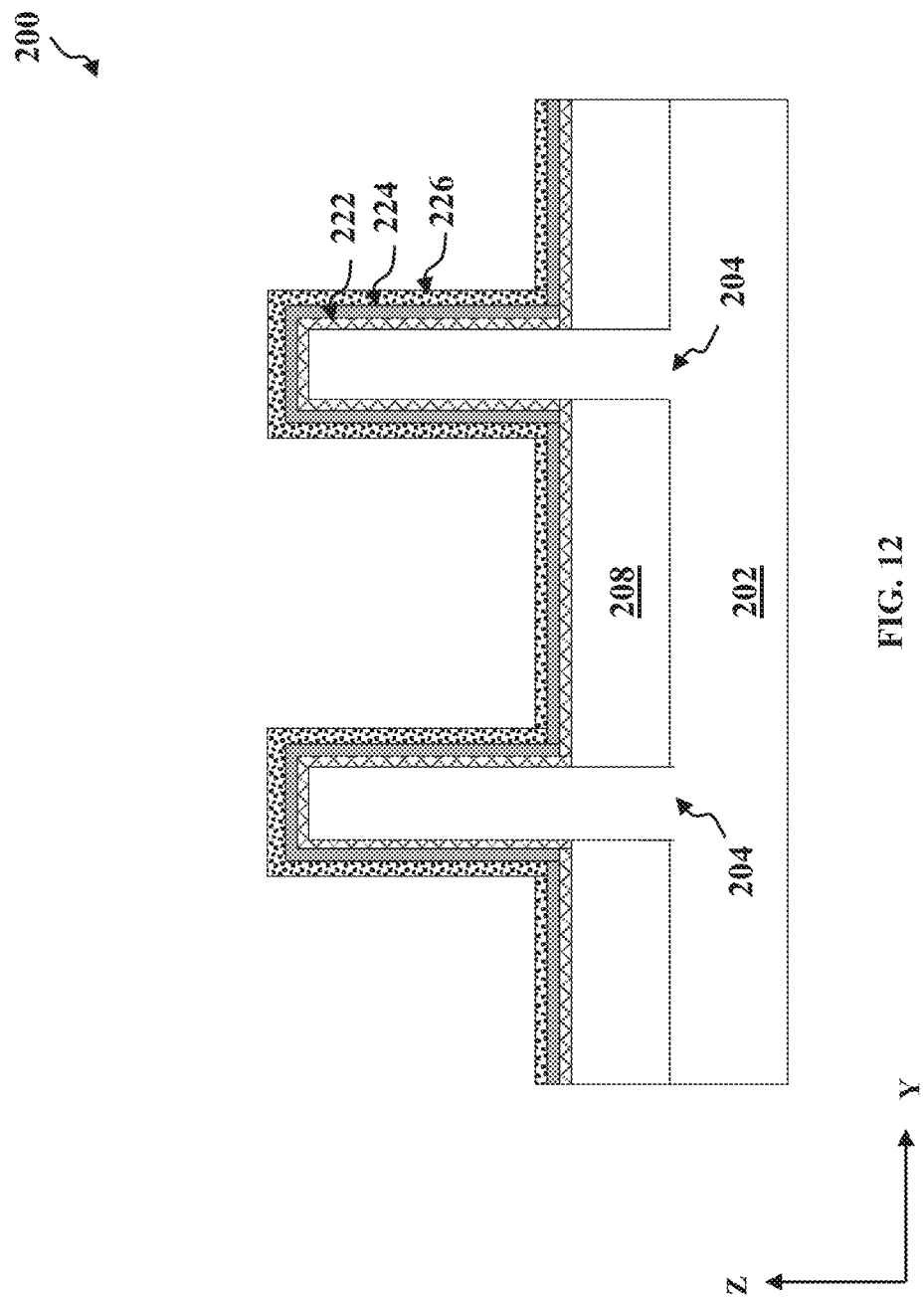

Referring to FIGS. 1 and 12-14, the method 100 at operation 114 forms a metal gate electrode over the capping layer 224. Referring to FIG. 12, the method 100 deposits a work function metal layer 226 over the capping layer 224. The work function metal layer 226 may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer 226 includes multiple material layers of the same (i.e., both n-type work function metal or both p-type work function metal) or different types in order to achieve a desired threshold voltage. For example, the work function metal layer may include an n-type work function metal layer formed over a p-type work function metal layer (or vice versa). The work function metal layer 226 may be formed by any suitable method, such as CVD, ALD, PVD, other suitable methods, or combinations thereof. In an example embodiment, the work function metal layer 226 is formed by an ALD process to a thickness of about 10 Angstrom to about 70 Angstrom. Of course, other thicknesses may also be applicable to the present disclosure depending upon specific design requirements.

Figure 13:
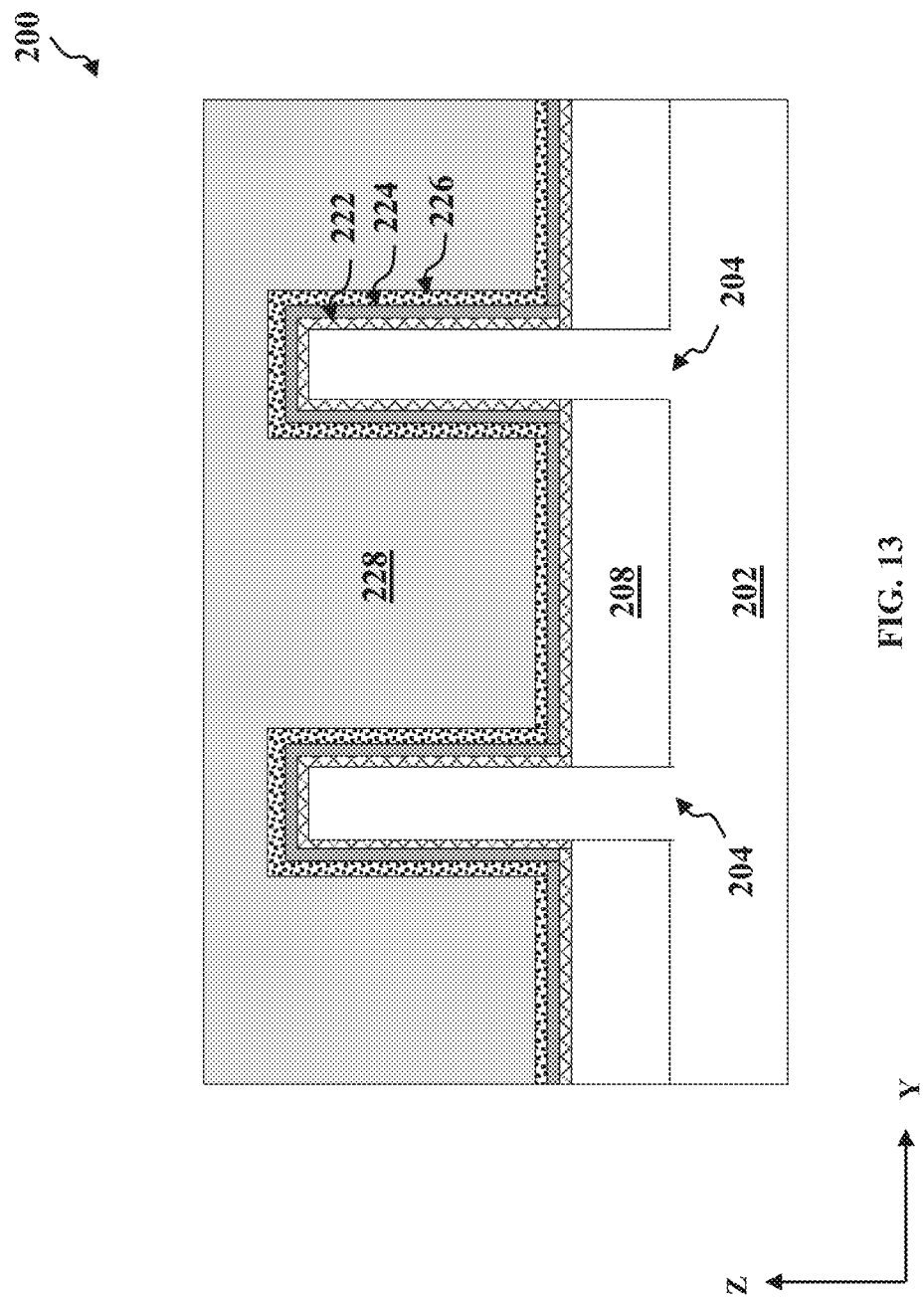
Figure 14:
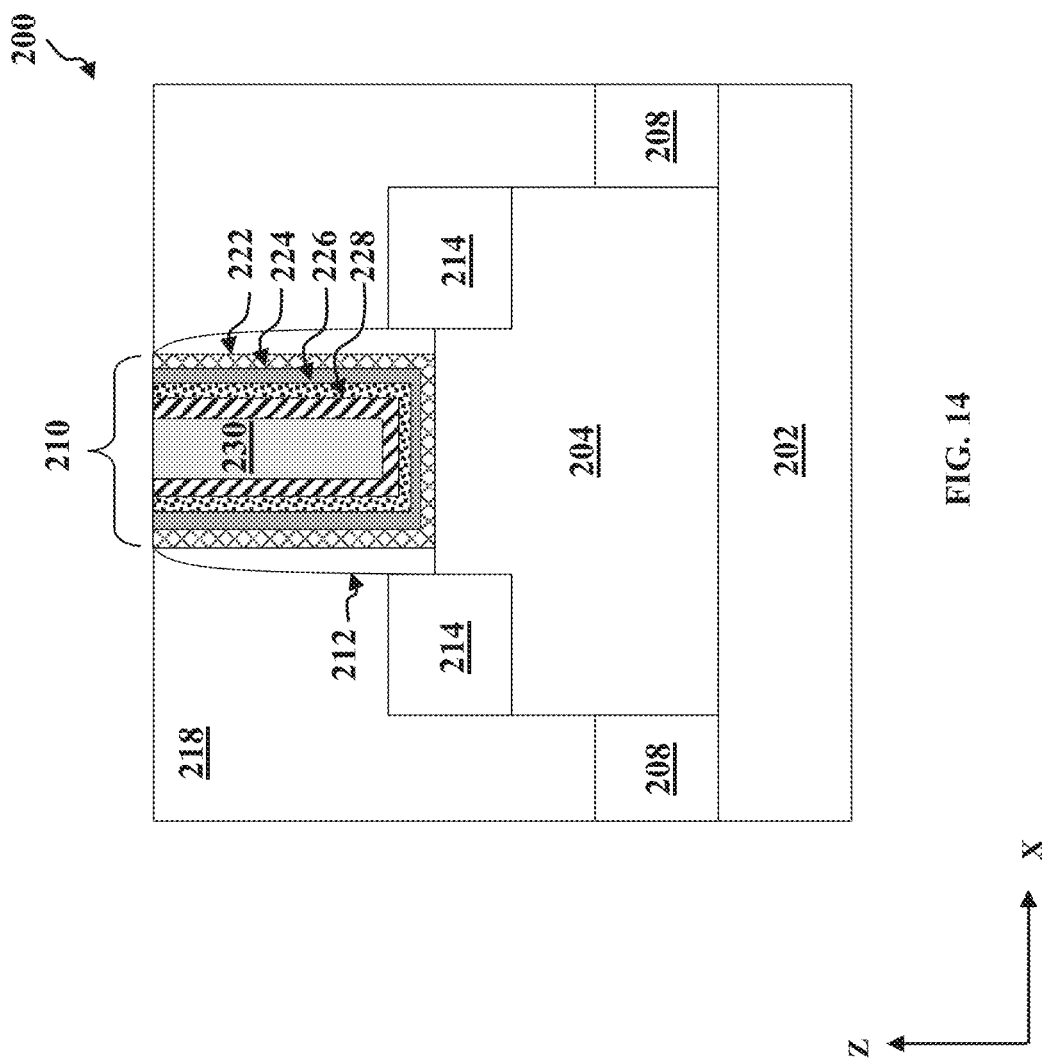

Referring to FIGS. 13 and 14, the method 100 forms a bulk conductive layer 228 over the work function metal layer 226. The bulk (or fill) conductive layer 228 may include aluminum (Al), copper (Cu), tungsten (W), cobalt (Co), ruthenium (Ru), other suitable conductive materials, or combinations thereof, and may be formed by any suitable method, such as CVD, ALD, PVD, plating, other suitable methods, or combinations thereof to a thickness of about 50 angstrom to about 500 angstrom. Of course, other thicknesses may also be applicable to the present disclosure depending upon specific design requirements. Thereafter, the method 100 may perform one or more polishing process (e.g., CMP) to remove any excess conductive materials and planarize the top surface of the device 200.

The method 100 at operation 114 may also form other material layers over the capping layer 224. For example, the method 100 may form an etch-stop layer (not depicted) between the capping layer 224 and the work function metal layer 226 to accommodate patterning of the work function metal layer 226. The etch-stop layer may include any suitable material, such as a titanium-containing material, a tantalum-containing material, a nitrogen-containing material, a silicon-containing material, other suitable materials, or combinations thereof. The etch-stop layer may, for example, include titanium nitride (TiN), tantalum nitride (TaN), titanium silicide (TiSi), and/or other suitable materials. The etch-stop layer may be formed by any suitable deposition process (e.g., ALD) to a thickness of about 10 Angstrom to about 30 angstrom, for example. The method 100 may additionally form a glue (or adhesive) layer (not depicted) before forming the bulk conductive layer 228. In some embodiments, the glue layer is configured to prevent peeling of the bulk conductive layer 228 (e.g., a W-containing bulk conductive layer). The glue layer may include a titanium-containing material, a tantalum-containing material, a tungsten-containing material, a nitrogen-containing material, other suitable materials, or combinations thereof. The glue layer may be formed by any suitable method (e.g., CVD, ALD, PVD, etc.) to a thickness of about 10 Angstrom to about 30 Angstrom, for example.

Referring to FIG. 1, the method 100 at operation 116 may perform additional processing steps. For example, additional vertical interconnect features such as contacts and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

Although not intended to be limiting, one or more embodiments of the present disclosure provide many benefits to a semiconductor device and the formation thereof. The present disclosure provides methods of forming an NCFET. In many embodiments, the NCFET includes a ferroelectric hafnium-containing (e.g., HfO2-containing) high-k gate dielectric layer fabricated by a series of deposition and annealing processes. Particularly, methods of transforming amorphous HfO2-containing dielectric material to ferroelectric orthorhombic HfO2-containing dielectric layer (i.e., including Pca21 phase) include simultaneously applying an electric field during a post-deposition annealing process. In many embodiments, embodiments provided herein allow formation of NCFETs with reduced subthreshold swing (SS) and thus improved negative-capacitance behavior.

In one aspect, the present disclosure provides a method that includes forming a hafnium-containing layer over a semiconductor layer, simultaneously performing a thermal annealing process and applying an electrical field to the hafnium-containing layer to form a ferroelectric hafnium-containing layer, and forming a gate electrode over the ferroelectric hafnium-containing layer.

In some embodiments where the electric field is a first electric field, forming the hafnium-containing layer includes depositing the hafnium-containing layer while applying a second electric field simultaneously.

In some embodiments, forming the hafnium-containing layer includes depositing hafnium oxide over the semiconductor layer. In further embodiments, simultaneously performing the thermal annealing process and applying of the electric field transforms amorphous hafnium oxide into crystalline hafnium oxide having a ferroelectric orthorhombic structure. In still further embodiments, the ferroelectric orthorhombic structure is designated by a space group of Pca21.

In some embodiments where the thermal annealing process is a first thermal annealing process, the method further includes depositing a capping layer over the ferroelectric hafnium-containing layer and performing a second thermal annealing process to the capping layer.

In some embodiments, forming the gate electrode includes forming at least one work function metal layer over the ferroelectric hafnium-containing layer and forming a bulk conductive layer over the at least one work function metal layer.

In another aspect, the present disclosure provides a method that includes forming a ferroelectric gate dielectric layer over a semiconductor layer, forming a capping layer over the ferroelectric gate dielectric layer, forming a work function metal layer over the capping layer, and forming a bulk conductive layer over the work function metal layer. In many embodiments, forming the ferroelectric gate dielectric layer includes depositing a hafnium oxide-based layer over the semiconductor layer and annealing the hafnium oxide-based layer to form the ferroelectric gate dielectric layer. In further embodiments, annealing the hafnium oxide-based layer includes applying an electric field to the hafnium oxide-based layer while performing the annealing.

In some embodiments, depositing the hafnium oxide-based layer includes depositing the hafnium oxide-based layer doped with Zr, Al, La, Ti, Ta, Si, Y, Sc, or combinations thereof.

In some embodiments, depositing the hafnium oxide-based layer includes depositing amorphous hafnium oxide over the semiconductor layer, and applying the electric field while performing the annealing transforms amorphous hafnium oxide to ferroelectric crystalline hafnium oxide. In further embodiments, transforming the amorphous hafnium oxide to the ferroelectric crystalline hafnium oxide includes forming an orthorhombic phase of hafnium oxide having a designation of Pca21.

In some embodiments, applying the electric field includes applying a direct-current electric field to the hafnium oxide-based layer.

In some embodiments where the electric field is a first electric field, depositing the hafnium oxide-based layer includes applying a second electric field while depositing. In further embodiments, applying the second electric field includes reducing a number of oxygen vacancies in the hafnium oxide-based layer.

In some embodiments, forming the capping layer includes depositing the capping layer over the ferroelectric gate dielectric layer and annealing the capping layer.

In some embodiments, annealing the hafnium oxide-based layer includes implementing a furnace annealing process, a rapid thermal annealing process, a spike annealing process, a laser annealing process, or combinations thereof.

In yet another aspect, the present disclosure provides a method that includes depositing a hafnium oxide-containing gate dielectric layer over a semiconductor layer while applying a first electric field simultaneously, annealing the hafnium oxide-containing gate dielectric layer while applying a second electric field simultaneously, and forming a metal gate electrode over the annealed hafnium oxide-containing gate dielectric layer.

In some embodiments, forming the metal gate electrode includes depositing a capping layer over the annealed hafnium oxide-containing gate dielectric layer, forming a work function metal layer over the capping layer, and forming a bulk conductive layer over the work function metal layer.

In some embodiments, annealing and applying the second electric field simultaneously results in a ferroelectric hafnium oxide-containing gate dielectric layer. In further embodiments, annealing and applying the second electric field simultaneously includes transforming hafnium oxide from an amorphous phase to a Pca21 orthorhombic phase.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a hafnium-containing layer over a semiconductor layer, wherein forming the hafnium-containing layer includes simultaneously applying a first electric field having a first strength;
   simultaneously performing a thermal annealing process and applying a second electrical field having a second strength to the hafnium-containing layer to form a ferroelectric hafnium-containing layer, wherein the second strength differs from the first strength in magnitude; and
   forming a gate electrode over the ferroelectric hafnium-containing layer.

2. The method of claim 1, wherein forming the hafnium-containing layer includes depositing hafnium oxide over the semiconductor layer.

3. The method of claim 2, wherein simultaneously performing the thermal annealing process and applying of the second electric field transforms amorphous hafnium oxide into crystalline hafnium oxide having a ferroelectric orthorhombic structure.

4. The method of claim 3, wherein the ferroelectric orthorhombic structure is designated by a space group of $Pca2_1$.

5. The method of claim 1, wherein the thermal annealing process is a first thermal annealing process, the method further comprising:
   depositing a capping layer over the ferroelectric hafnium-containing layer; and
   performing a second thermal annealing process to the capping layer.

6. The method of claim 1, wherein forming the gate electrode includes:
   forming at least one work function metal layer over the ferroelectric hafnium-containing layer; and
   forming a bulk conductive layer over the at least one work function metal layer.

7. The method of claim 1, wherein the second strength is greater than the first strength in magnitude.

8. A method, comprising:
   forming a ferroelectric gate dielectric layer over a semiconductor layer, wherein forming the ferroelectric gate dielectric layer includes:
      depositing a hafnium oxide-based layer over the semiconductor layer, wherein depositing the hafnium oxide-based layer includes simultaneously applying a first electric field to the hafnium oxide-based layer, thereby causing structural rearrangement of hafnium and oxygen atoms of the hafnium oxide-based layer; and
      annealing the hafnium oxide-based layer to form the ferroelectric gate dielectric layer, wherein annealing the hafnium oxide-based layer includes simultaneously applying a second electric field to the hafnium oxide-based layer while performing the annealing;
   forming a capping layer over the ferroelectric gate dielectric layer;
   forming a work function metal layer over the capping layer; and
   forming a bulk conductive layer over the work function metal layer.

9. The method of claim 8, wherein depositing the hafnium oxide-based layer includes depositing the hafnium oxide-based layer doped with Zr, Al, La, Ti, Ta, Si, Y, Sc, or combinations thereof.

10. The method of claim 8, wherein depositing the hafnium oxide-based layer includes depositing amorphous hafnium oxide over the semiconductor layer, and wherein applying the second electric field while performing the annealing transforms amorphous hafnium oxide to ferroelectric crystalline hafnium oxide.

11. The method of claim 10, wherein transforming the amorphous hafnium oxide to the ferroelectric crystalline hafnium oxide includes forming an orthorhombic phase of hafnium oxide having a designation of $Pca2_1$.

12. The method of claim 8, wherein applying the second electric field includes applying a direct-current electric field to the hafnium oxide-based layer.

13. The method of claim 8, wherein causing the structural rearrangement of hafnium and oxygen atoms in the hafnium oxide-based layer reduces a number of oxygen vacancies in the hafnium oxide-based layer.

14. The method of claim 8, wherein forming the capping layer includes:
   depositing the capping layer over the ferroelectric gate dielectric layer; and
   annealing the capping layer.

15. The method of claim 8, wherein annealing the hafnium oxide-based layer includes implementing a furnace annealing process, a rapid thermal annealing process, a spike annealing process, a laser annealing process, or combinations thereof.

16. The method of claim 8, wherein the first electric field is applied at a first strength and the second electric field is applied at a second strength, the second strength being greater than the first strength in magnitude.

17. A method, comprising:
   depositing a hafnium oxide-containing gate dielectric layer over a semiconductor layer while applying a first electric field simultaneously;
   annealing the hafnium oxide-containing gate dielectric layer while applying a second electric field simultaneously; and
   forming a metal gate electrode over the annealed hafnium oxide-containing gate dielectric layer.

18. The method of claim 17, wherein forming the metal gate electrode includes:

depositing a capping layer over the annealed hafnium oxide-containing gate dielectric layer;

forming a work function metal layer over the capping layer; and forming a bulk conductive layer over the work function metal layer.

19. The method of claim 17, wherein annealing and applying the second electric field simultaneously results in a ferroelectric hafnium oxide-containing gate dielectric layer.

20. The method of claim 19, wherein annealing and applying the second electric field simultaneously includes transforming hafnium oxide from an amorphous phase to a $Pca2_1$ orthorhombic phase.

* * * * *